(12) United States Patent  
Dono et al.

(10) Patent No.: US 7,835,213 B2  
(45) Date of Patent: Nov. 16, 2010

(54) SEMICONDUCTOR MEMORY DEVICE

(75) Inventors: Chiaki Dono, Tokyo (JP); Yasuji Koshikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 74 days.

(21) Appl. No.: 12/325,026

(22) Filed: Nov. 28, 2008

(65) Prior Publication Data

US 2010/0054035 A1 Mar. 4, 2010

(30) Foreign Application Priority Data

Sep. 1, 2008 (JP) ............................. 2008-223510

(51) Int. Cl.
*G11C 5/14* (2006.01)
(52) U.S. Cl. ...................................... 365/226; 365/227
(58) Field of Classification Search .................. 365/226, 365/227
See application file for complete search history.

(56) References Cited

U.S. PATENT DOCUMENTS 6,195,305 B1 * 2/2001 Fujisawa et al. ............ 365/226

FOREIGN PATENT DOCUMENTS

JP 11-297950 A 10/1999
JP 2004-200714 A 7/2004

* cited by examiner

*Primary Examiner*—Huan Hoang
*Assistant Examiner*—Jason Lappas
(74) *Attorney, Agent, or Firm*—Sughrue Mion, PLLC

(57) ABSTRACT

A semiconductor memory device with low power consumption and improved transfer rate of an input/output buffer at reduced manufacturing cost is provided. Thick-film transistors are used for a memory cell array 33, a row decoder 30, and a sense amplifier 32, surrounded by a bold broken line. Thick-film transistors having a threshold voltage lower than the aforementioned transistors are used for input buffers 11 to 13 and an input/output buffer 26, surrounded by a bold line. Thin-film transistors are used for a clock generator 16, a command decoder 17, a mode register 18, a controller 20, a row address buffer and refresh counter 21, a column address buffer and burst counter 22, a data control circuit 23, a latch circuit 24, a DLL 25, and a column decoder 31.

4 Claims, 4 Drawing Sheets

SEMICONDUCTOR MEMORY DEVICE

REFERENCE TO RELATED APPLICATION

This application is based upon and claims the benefit of the priority of Japanese patent application No. 2008-223510, filed on Sep. 1, 2008, the disclosure of which is incorporated herein in its entirety by reference thereto.

FIELD OF THE INVENTION

The present invention relates to a semiconductor memory device, and particularly to a technology regarding how transistors are configured in a semiconductor memory device.

BACKGROUND

Semiconductor memory such as DRAM is constituted by three basic components: a memory cell array, an input/output buffer, and peripheral circuits interposed between the memory cell array and the input/output buffer. The power supply voltage supplied to the semiconductor memory is boosted or lowered before being supplied to each unit. Therefore transistors constituting each unit are configured so that they have appropriate oxide film thicknesses and threshold voltages (Vth) and that they have a predetermined breakdown voltage.

For instance, transistors having thick gate oxide films are used for the memory cell constituting DRAM because they need to have a high breakdown voltage. On the other hand, transistors having thin gate oxide films are used for the peripheral circuits while transistors having thick gate oxide films, as in the case with the memory cell, are used for the input/output buffer (refer to Patent Documents 1 and 2).

In the semiconductor memory configured as described, the thickness of the gate oxide films of the transistors used in the input/output buffer is the same as that of the gate oxide films of other transistors, therefore the manufacturing process can be simplified by using the same dopants for channel regions, resulting in the reduction of the manufacturing costs.

[Patent Document 1]
Japanese Patent Kokai Publication No. JP-A-11-297950
[Patent Document 2]
Japanese Patent Kokai Publication No. JP-P2004-200714A

SUMMARY OF THE DISCLOSURE

The entire disclosures of Patent Documents 1 and 2 are incorporated herein by reference thereto.

The following analysis has been made in view of the present invention.

In recent years, as there have been growing demands for reducing power consumption, the voltage for operating the peripheral circuits has been lowered and it has become necessary to reduce the thickness of oxide films in order to obtain a performance equal to that of conventional transistors. In this case, the power supply voltage is higher for the input/output circuits than for the peripheral circuits. Therefore, three basic levels of power supply voltages are required: VPERI for the peripheral circuits (for instance 1.3V); VDD for the input/output circuits (for instance 1.8V); and VPP for the array circuit (for instance 2.8V). In this case, it is preferable that transistors having an appropriate oxide film thickness, corresponding to each power supply voltage, i.e., different film thicknesses for VPERI, VDD, and VPP, be provided. However, having three different kinds of transistors leads to extra steps in the manufacturing process of the semiconductor memory.

In order to solve this drawback, there is an attempt that only two kinds of oxide film thicknesses are used in the semiconductor memory. In such a configuration, the following combinations of transistors can be desired.

(1) For VDD and VPP, the same kind of transistors are used.

(2) For VPERI and VDD, the same kind of transistors are used.

In the case of (1), the performance of the input/output circuit (VDD) suffers, and in the scenario (2), the performance of the peripheral circuits (VPERI) deteriorates. In the semiconductor memory, for which high speed operation is demanded, the peripheral circuits and the input/output circuits must operate at high speed and the performance deterioration of the transistors concerned may cause a malfunction of the product. Thus, there is much to be desired in the art.

According to an aspect of the present invention, there is provided a semiconductor memory device, which comprises a memory cell array including a plurality of dynamic memory cells, an input/output buffer, and peripheral circuits interposed between the memory cell array and the input/output buffer. In this semiconductor memory device, the memory cell array comprises a first transistor having a first gate insulation film thickness; the peripheral circuits comprise second transistors having a second gate insulation film thickness thinner than the first gate insulation film thickness; and the input/output buffer comprises a third transistor having the first gate insulation film thickness and a threshold voltage lower than the threshold voltage of the first transistor.

According to another aspect of the present invention, there is provided a semiconductor memory device, which comprises a memory cell array including a plurality of dynamic memory cells, an input/output buffer, and peripheral circuits interposed between the memory cell array and the input/output buffer. In this semiconductor memory device, the memory cell array comprises a first transistor having a first gate insulation film thickness; the input/output buffer comprises a second transistor having a second gate insulation film thickness thinner than the first gate insulation film thickness; and the peripheral circuits comprise fourth transistors having the second gate insulation film thickness and a threshold voltage lower than the threshold voltage of the second transistor.

The meritorious effects of the present invention are summarized as follows.

According to the present invention, while achieving low power consumption and improving the transfer rate of an input/output buffer, an increase in manufacturing cost can be reduced since only two kinds of transistor film thickness are used.

BRIEF DESCRIPTIONS OF THE DRAWINGS

PREFERRED MODES OF THE INVENTION

A semiconductor memory device relating to an exemplary embodiment of the present invention comprises a memory cell array including a plurality of dynamic memory cells, an input/output buffer, and peripheral circuits interposed between the memory cell array and the input/output buffer. For the memory cell array, a transistor (a first transistor) having a thick film (a first gate insulation film thickness) is used. Here, in a first example, a transistor (a second transistor) having a thin film (a second gate insulation film thickness) is used for the peripheral circuits, and for the input/output buffer, a thick-film transistor (a third transistor), as the one used in the memory cell array, having a threshold voltage (low Vth) lower than that of the transistor in the memory cell array is used. Further, in a second example, the thin-film transistor (the second transistor) having the thin film (the second gate insulation film thickness) is used for the input/output buffer, and a thin-film transistor (a fourth transistor) having the threshold voltage (low Vth) lower than that of the second transistor is used for the peripheral circuits. The gate insulation film may be an oxide film, for instance.

It is preferable that a boosting circuit that boosts an external power supply voltage supplied and supplies the result to the memory cell array as a power source and a low voltage circuit that lowers the external power supply voltage and supplies the result to the peripheral circuits as a power source be provided and that the boosting circuit and the low voltage circuit be made up by transistors having the first gate insulation film thickness.

It is preferable that the input/output buffer include a slew rate control circuit, an ODT (on-die termination) control circuit, an output buffer driven by the slew rate control circuit, and an ODT buffer driven by the ODT control circuit and that the slew rate control circuit and the ODT control circuit comprise the third transistors in the first example and the second transistors in the second example.

The output buffer and the ODT buffer may comprise the third transistors in the first example and the second transistors in the second example.

In the semiconductor memory device configured as above, the peripheral circuits, formed by the transistors having an oxide film thickness optimized for operation with the low power supply voltage, operate at a high speed and consume low power since they operate with a low power supply voltage. Further, by using the memory cell transistors constituting the memory cell array or the transistors having the same gate insulation film thickness as that of the transistors constituting the peripheral circuits in the input/output buffer, the manufacturing process can be simplified, resulting in the reduction of the manufacturing costs.

The present invention will be described in detail with reference to the drawings.

Example 1

Figure 1:
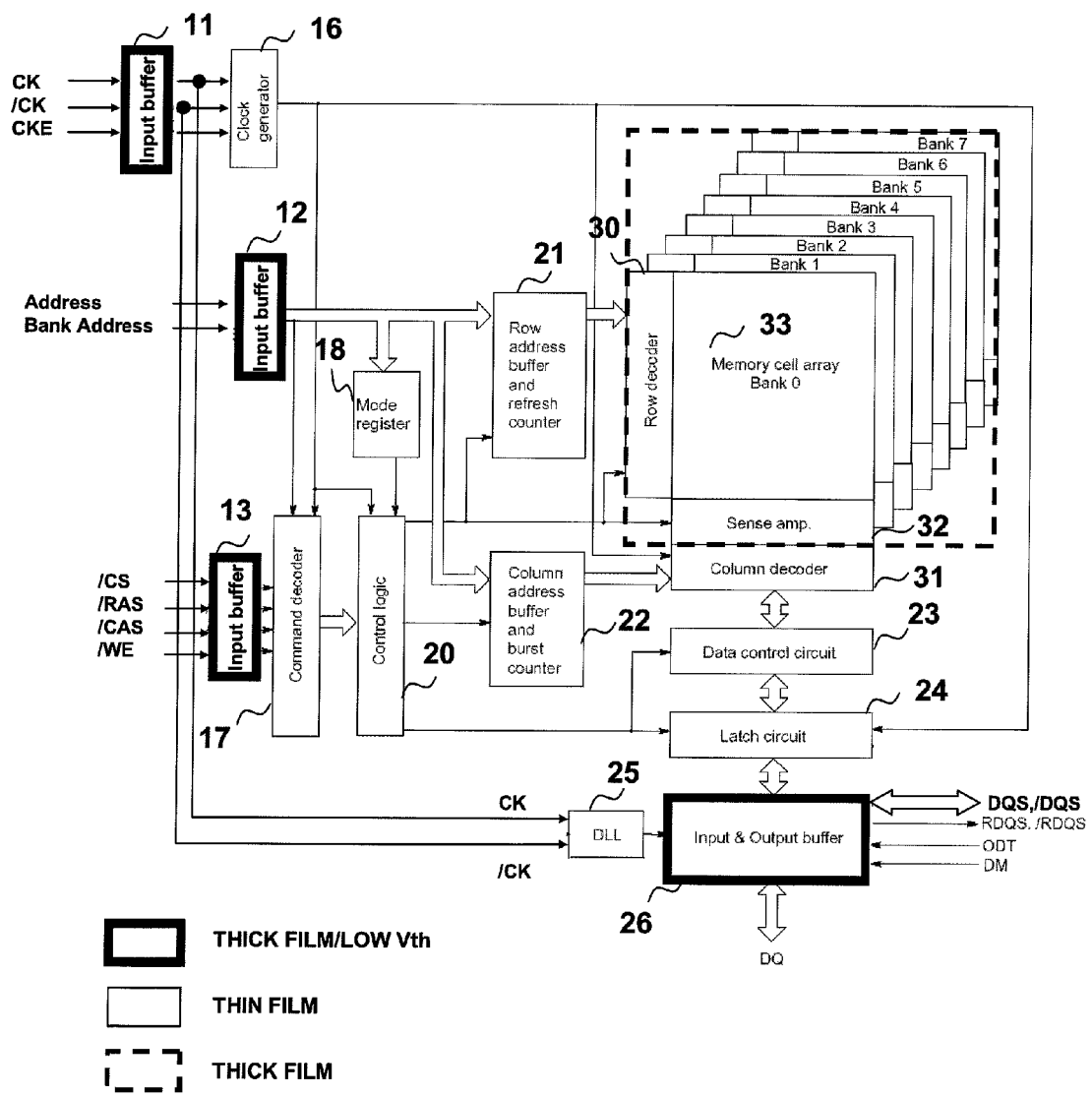
FIG. 1 is a first block diagram showing the configuration of a semiconductor memory device relating to a first example of the present invention.

FIG. 1 is a first block diagram showing the configuration of a semiconductor memory device relating to the first example of the present invention. In FIG. 1, the semiconductor memory device is a DRAM comprising input buffers 11 to 13, a clock generator 16, a command decoder 17, a mode register 18, a controller 20, a row address buffer and refresh counter 21, a column address buffer and burst counter 22, a data control circuit 23, a latch circuit 24, a DLL (Delay-Locked Loop) 25, an input/output buffer 26, a row decoder 30, a column decoder 31, a sense amplifier 32, and a memory cell array 33.

The clock generator 16 receives clock signals CK, /CK and a clock enable signal CKE from the outside via the input buffer 11 and supplies a clock signal having a predetermined timing to each of the command decoder 17, the controller 20, the latch circuit 24, and the column decoder 31.

The command decoder 17 receives a chip select signal /CS, a row address strobe signal /RAS, a column address strobe signal /CAS, and a write enable signal /WE from the outside via the input buffer 13, also receives an address signal Address from the outside via the input buffer 12, generates a command signal determining the operation of the DRAM, and outputs the command signal to the controller 20.

The mode register 18 receives the address signal Address from the outside via the input buffer 12 and holds data for determining the operation mode of the DRAM.

The controller 20 receives the data held by the mode register 18 and the command signal from the command decoder 17 and controls the operations of the row address buffer and refresh counter 21, the column address buffer and burst counter 22, the data control circuit 23, the latch circuit 24, the row decoder 30, and the sense amplifier 32 at a predetermined timing.

The row address buffer and refresh circuit 21 receives the address signal Address and a bank address signal BankAddress from the outside via the input buffer 12, generates a row address and an address for refreshing, and supplies these addresses to the row decoder 30.

The column address buffer and burst counter 22 receives the address signal Address and the bank address signal BankAddress from the outside via the input buffer 12, generates a column address or a burst signal, and supplies it to the column decoder 31.

The memory cell array 33 includes a plurality of dynamic memory cells and is constituted by a plurality of banks. A read operation or write operation, controlled by the controller 20 via the sense amplifier 32, is performed on memory cells specified by the data from the column decoder 31 and the data from the row decoder 30.

The DLL 25 receives the clock signals CK and /CK from the outside via the input buffer 11 and generates an input/output timing signal for the input/output buffer 26.

A DQ signal as write data is written to the specified memory cells via the input/output buffer 26, the latch circuit 24, the data control circuit 23, and the sense amplifier 32. Further, data read out from the specified memory cells are outputted externally as the DQ signal, which is read-out data, via the sense amplifier 32, the data control circuit 23, the latch circuit 24, and the input/output buffer 26.

Data strobe signals DQS and /DQS indicating the input/output timing of the DQ signal are outputted from the input/output buffer 26, or are fed to the input/output buffer 26.

An on-die termination signal ODT is fed to the input/output buffer 26 and activates the function to reduce the signal reflection of the DQ signal using an internal resistance element in the input/output buffer 26. A write mask enable signal DM is fed to the input/output buffer 26 and masks the write data.

Data strobe signals RDQS and /RDQS are outputted from the input/output buffer 26 to the outside as signals indicating the timing of the DQ signal, which is read-out data, when the device is in a specific mode.

In the semiconductor memory device configured as described, the transistors (the first transistors) having the thick films (the first gate insulation film thickness) are used in the memory cell array 33, the row decoder 30, and the sense amplifier 32, surrounded by a bold broken line in FIG. 1. Further, the transistors (the third transistors) having the same thick films and the threshold voltage (low Vth) lower than that of the first transistors are used in the input buffers 11 to 13 and the input/output buffer 26, surrounded by bold lines in FIG. 1. The transistors (the second transistors) having the thin films (the second gate insulation film thickness) are used for the other parts, i.e., the clock generator 16, the command decoder 17, the mode register 18, the controller 20, the row address buffer and refresh counter 21, the column address buffer and burst counter 22, the data control circuit 23, the latch circuit 24, the DLL 25, and the column decoder 31.

Figure 2:
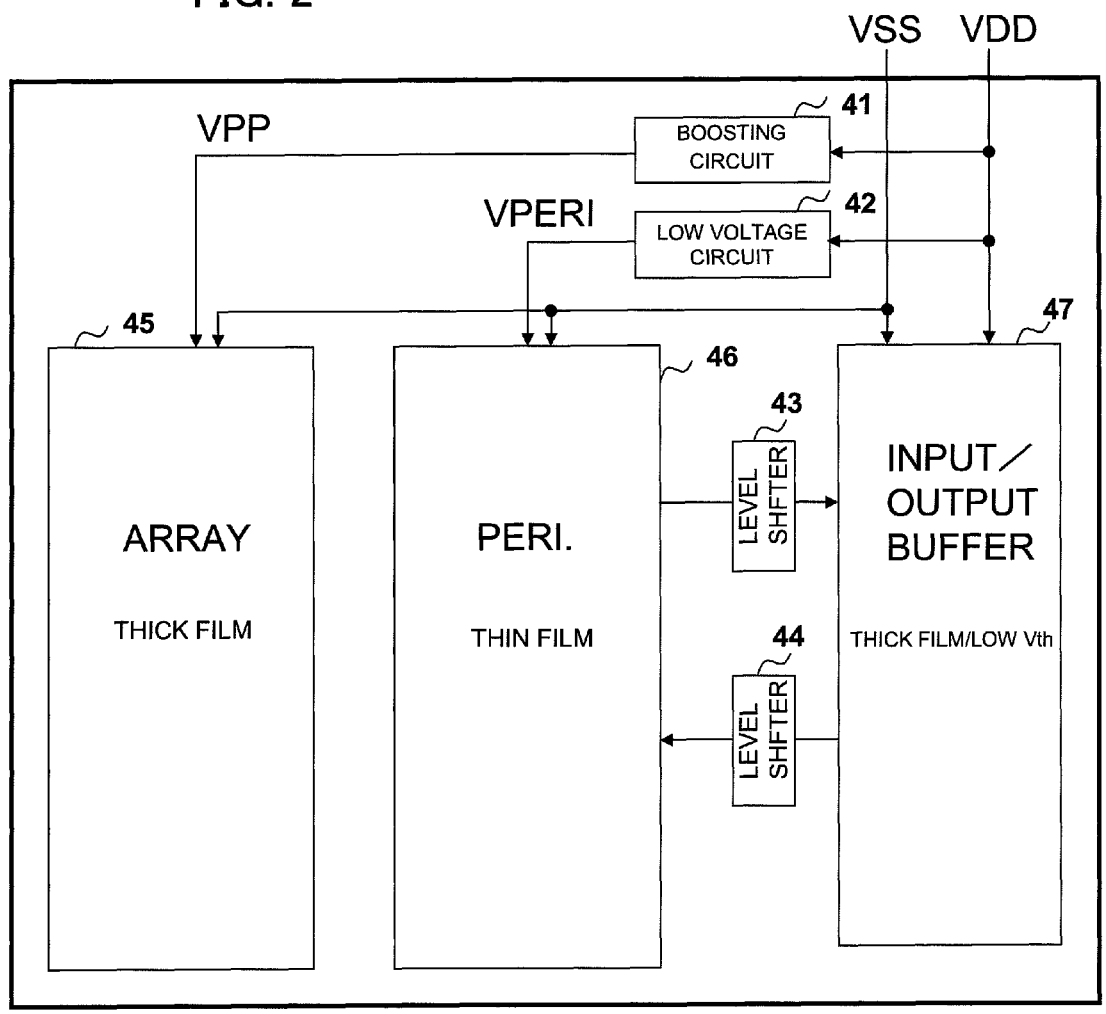
FIG. 2 is a second block diagram showing the configuration of the semiconductor memory device relating to the first example of the present invention.

FIG. 2 is a second block diagram showing the configuration of the semiconductor memory device relating to the first example of the present invention. In FIG. 2, the semiconductor memory device comprises a boosting circuit 41, a low voltage circuit, and level shifters 43 and 44.

The boosting circuit 41 is constituted by the transistors (the first transistors) having the thick films (the first gate insulation film thickness), and it boosts a power supply voltage VDD (for instance 1.8V) supplied externally and supplies the result to a memory cell array 45 as a power supply voltage VPP (for instance 2.8V). It should be noted that the memory cell array 45 is the same as the memory cell array 33 in FIG. 1 and corresponds to the area surrounded by the bold broken line.

The low voltage circuit 42 is constituted by the transistors (the first transistors) having the thick films (the first gate insulation film thickness), and it lowers the power supply voltage VDD supplied externally and supplies the result to peripheral circuits 46 as a power supply voltage VPERI (for instance 1.3V). It should be noted that the peripheral circuits 46 corresponds to the areas not surrounded by the bold broken line or the bold lines in FIG. 1.

An input/output buffer 47 corresponds to the areas surrounded by the bold lines (the input buffer 11 to 13 and the input/output buffer 26) in FIG. 1 and comprises the level shifters 43 and 44 between the peripheral circuits 46 and itself.

The input/output buffer 47 and the peripheral circuits 46 operate with different power supply voltages and signal levels. Therefore, the level shifter 43 increases the level of a signal outputted from the peripheral circuits 46 and outputs the result to the input/output buffer 47. The level shifter 44 lowers the level of a signal outputted from the input/output buffer 47 and outputs the result to the peripheral circuits 46.

In the configuration described above, a power supply voltage of 2.8V (for instance) is supplied to the memory cell transistors in the memory cell array and a power supply voltage of 1.8V (for instance) is supplied to the input/output buffer. Therefore high speed operation cannot be achieved if transistors same as the ones used in the memory cell array are used for the input/output buffer. By using the transistors having the low threshold Vt for the input/output buffer, the transfer rate can be improved.

Figure 3:
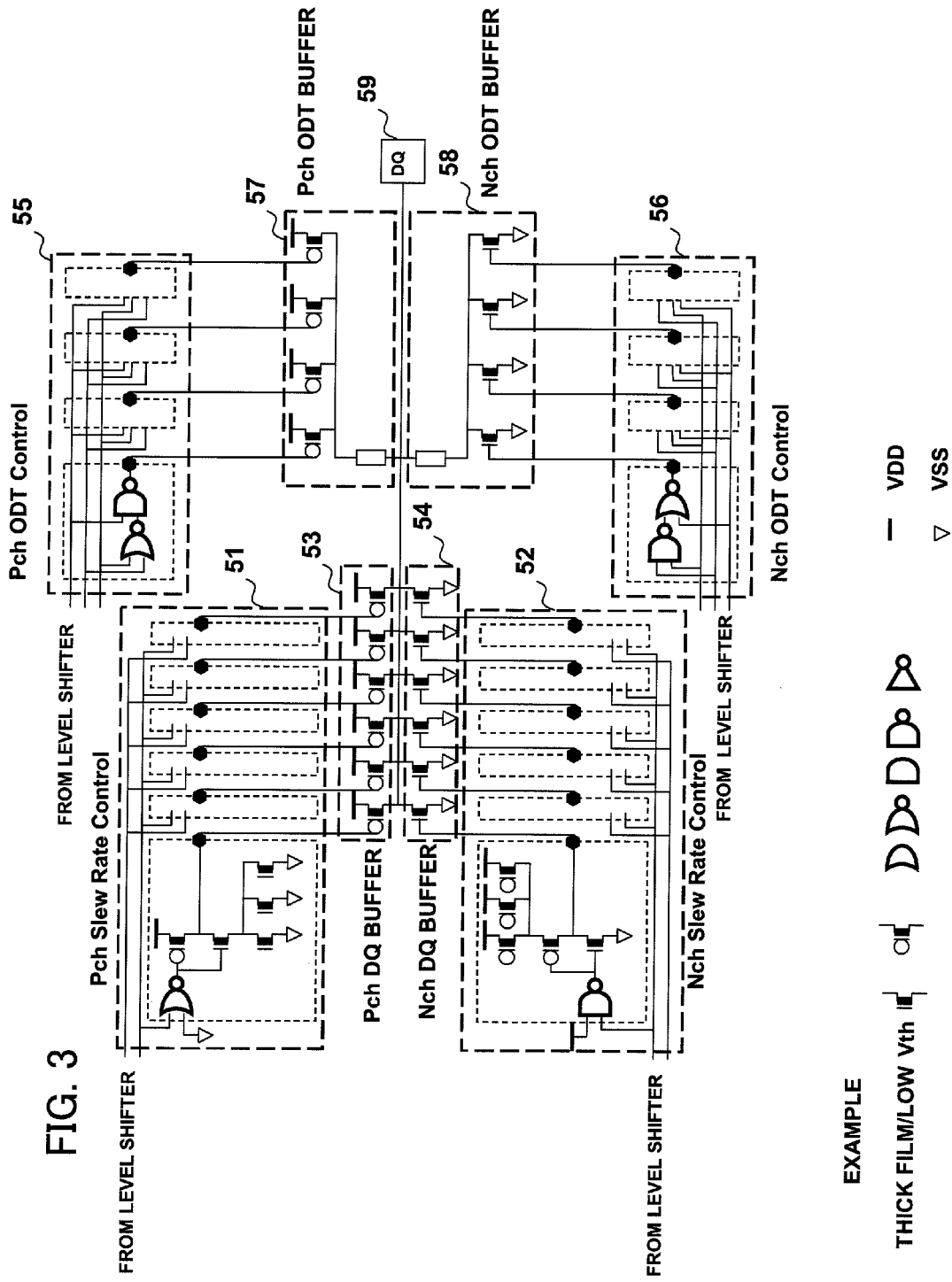
FIG. 3 is a circuit diagram of an output buffer relating to the first example of the present invention.

FIG. 3 is a circuit diagram of an output buffer, which is a part of the input/output buffer 26. In FIG. 3, the output buffer is constituted by CMOS circuits and comprises a slew rate controller 51 on the P-channel side, a slew rate controller 52 on the N-channel side, a DQ buffer 53 on the P-channel side, a DQ buffer 54 on the N-channel side, an ODT controller 55 on the P-channel side, an ODT controller 56 on the N-channel side, an ODT buffer 57 on the P-channel side, an ODT buffer 58 on the N-channel side, and a pad 59.

By controlling the number of P-channel transistors active in the DQ buffer 53 using the signal from the level shifter, the slew rate controller 51 varies the rising slew rate of an output signal from the pad 59.

By controlling the number of N-channel transistors active in the DQ buffer 54 using the signal from the level shifter, the slew rate controller 52 varies the falling slew rate of the output signal from the pad 59.

By controlling the number of P-channel transistors active in the ODT buffer 57 using the signal from the level shifter, the ODT controller 55 varies the terminal resistance value of the pad 59.

By controlling the number of N-channel transistors active in the ODT buffer 58 using the signal from the level shifter, the ODT controller 56 varies the terminal resistance value of the pad 59.

The output buffer configured as described is constituted by P-channel transistors and N-channel transistors having the thick films (the first gate insulation film thickness) and the low threshold voltage Vt.

Further, in the case where the output buffer is turned off and a leak current at the pad 59 is more than a predetermined value, the leak current may be reduced by using transistors having the thick films (the first gate insulation film thickness) and a high threshold voltage Vt for the DQ buffers 53 and 54 and the ODT buffers 57 and 58.

Further, since the input buffer has only its gate connected to the pad, which is the input terminal, there is no influence from the leak current and the input buffer can be constituted by transistors having low threshold voltages.

In the semiconductor memory device configured as above, low power consumption can be achieved and the transfer rate of the input/output buffer can be improved. Further, by using only two kinds of transistors (thick film and thin film), an increase in manufacturing cost can be reduced.

Example 2

Figure 4:
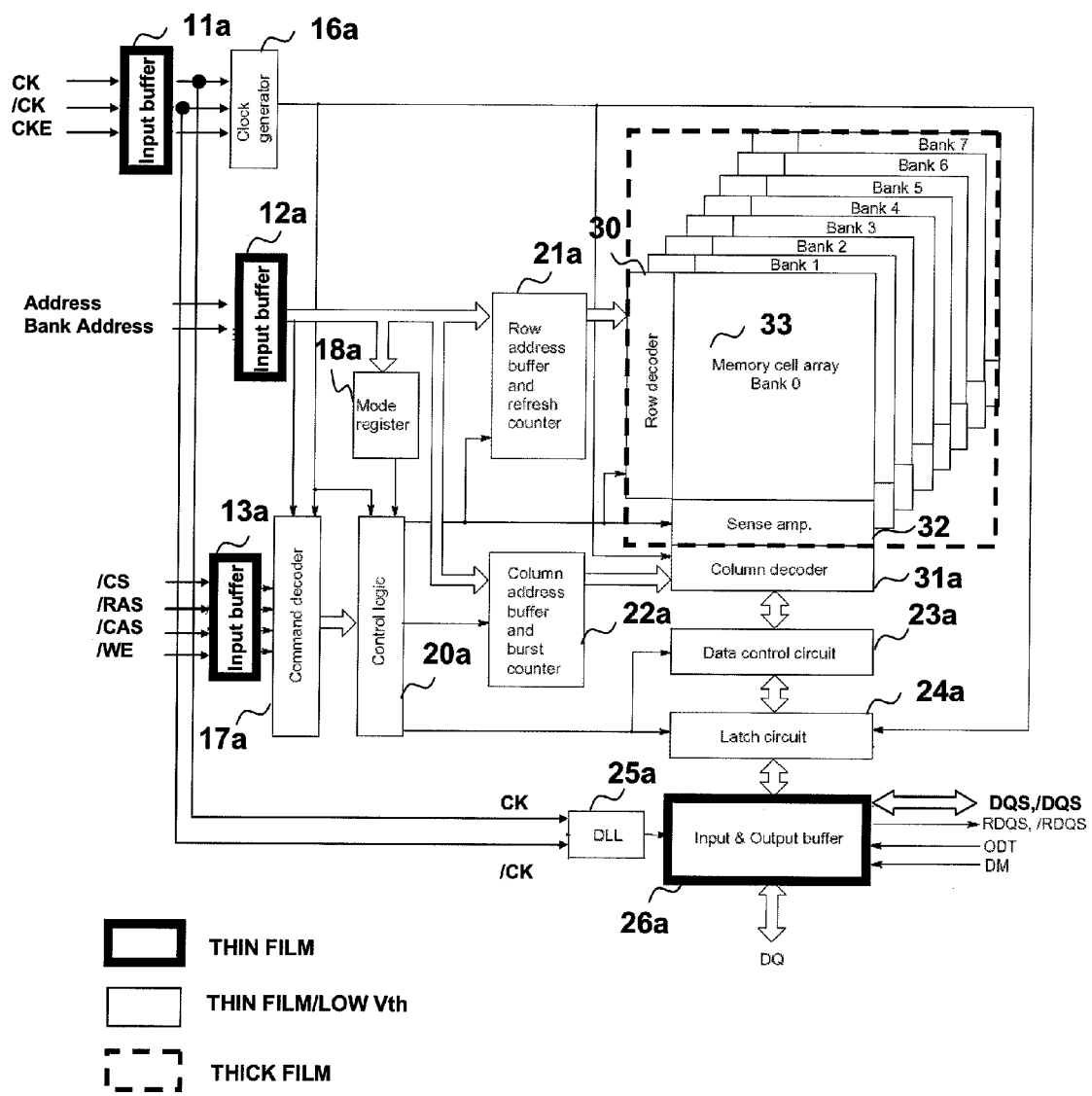
FIG. 4 is a block diagram showing the configuration of a semiconductor memory device relating to a second example of the present invention.

FIG. 4 is a block diagram showing the configuration of a semiconductor memory device relating to a second example of the present invention. In FIG. 4, the semiconductor memory device is a DRAM comprising input buffers 11a to 13a, a clock generator 16a, a command decoder 17a, a mode register 18a, a controller 20a, a row address buffer and refresh counter 21a, a column address buffer and burst counter 22a, a data control circuit 23a, a latch circuit 24a, a DLL 25a, an input/output buffer 26a, the row decoder 30, a column decoder 31a, the sense amplifier 32, and the memory cell array 33. The row decoder 30, the sense amplifier 32, and the memory cell array 33 are identical to the ones with the same symbols in FIG. 1.

The transistors (the second transistors) having the thin films (the second gate insulation film thickness) are used for the input buffers 11a to 13a and the input/output buffer 26a, although they respectively have the same functions as those of the input buffers 11 to 13 and the input/output buffer 26 in FIG. 1. By using the transistors (the second transistors) having the thin films (the second gate insulation film thickness), the input buffers 11a to 13a and the input/output buffer 26a are optimized for operation with the low power supply voltage, resulting in an improved transfer rate. The gate insulation film may be an oxide film, for instance.

The clock generator 16a, the command decoder 17a, the mode register 18a, the controller 20a, the row address buffer and refresh counter 21a, the column address buffer and burst counter 22a, the data control circuit 23a, the latch circuit 24a, the DLL 25a, and the column decoder 31a, respectively, have the same functions as those of the clock generator 16, the command decoder 17, the mode register 18, the controller 20, the row address buffer and refresh counter 21, the column address buffer and burst counter 22, the data control circuit 23, the latch circuit 24, the DLL 25, and the column decoder 31 in FIG. 1. However, the transistors (the fourth transistors) having the thin film (the second gate insulation film thickness) and the threshold voltage (low Vth) lower than that of the transistors used in the input buffers 11a to 13a and the input/output buffer 26a are used. These peripheral circuits are optimized for operation with the lower power supply voltage by using the transistors having the thin film (the second gate insulation film thickness) and the lower threshold voltage (low Vth).

In the semiconductor memory device configured as described, low power consumption can be achieved and the transfer rate of the input/output buffer can be improved as in Example 1. Further, by using only two kinds of transistors (thick film and thin film), an increase in manufacturing cost can be reduced.

Each disclosure of the aforementioned Patent Documents is incorporated by reference thereto in the present application.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory comprising:
    a memory cell array including a plurality of dynamic memory cells;
    an input/output buffer; and
    peripheral circuits interposed between the memory cell array and the input/output buffer;
    wherein said memory cell array comprises
    a first transistor having a first gate insulation film thickness;
    said peripheral circuits comprise second transistors having a second gate insulation film thickness thinner than the first gate insulation film thickness; and
    said input/output buffer comprises a third transistor having the first gate insulation film thickness and a threshold voltage lower than the threshold voltage of said first transistor,
    wherein said input/output buffer includes a slew rate control circuit, an ODT control circuit, an output buffer driven by the slew rate control circuit, and an ODT buffer driven by the ODT control circuit; and
    said slew rate control circuit and said ODT control circuit comprise said third transistors.

2. The semiconductor memory device as defined in claim 1 wherein said output buffer and said ODT buffer comprise said third transistors.

3. A semiconductor memory device comprising:
    a memory cell array including a plurality of dynamic memory cells;
    an input/output buffer; and
    peripheral circuits interposed between the memory cell array and the input/output buffer;
    wherein said memory cell array comprises
    a first transistor having a first gate insulation film thickness;
    said input/output buffer comprises a second transistor having a second gate insulation film thickness thinner than the first gate insulation film thickness; and
    said peripheral circuits comprise fourth transistors having the second gate insulation film thickness and a threshold voltage lower than the threshold voltage of said second transistor,
    wherein said input/output buffer includes a slew rate control circuit, an ODT control circuit, an output buffer driven by the slew rate control circuit, and an ODT buffer driven by the ODT control circuit; and said slew rate control circuit and said ODT control circuit comprise said second transistors.

4. The semiconductor memory device as defined in claim 3 wherein said output buffer and said ODT buffer comprise said second transistors.

* * * * *